(12) United States Patent
Shiobara et al.

(10) Patent No.: US 9,401,290 B2
(45) Date of Patent: Jul. 26, 2016

(54) SEMICONDUCTOR APPARATUS AND METHOD FOR PRODUCING THE SAME

(71) Applicant: SHIN-ETSU CHEMICAL CO., LTD., Tokyo (JP)

(72) Inventors: Toshio Shiobara, Annaka (JP); Susumu Sekiguchi, Takasaki (JP); Hideki Akiba, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/776,107

(22) Filed: Feb. 25, 2013

(65) Prior Publication Data

US 2013/0241087 A1 Sep. 19, 2013

(30) Foreign Application Priority Data

Mar. 13, 2012 (JP) .................................. 2012-56202

(51) Int. Cl.
*H01L 21/00* (2006.01)
*H01L 21/56* (2006.01)
(Continued)

(52) U.S. Cl.
CPC ............ *H01L 21/565* (2013.01); *H01L 21/561* (2013.01); *H01L 23/293* (2013.01); *H01L 24/97* (2013.01); *H01L 23/3128* (2013.01); *H01L 2224/45144* (2013.01);
(Continued)

(58) Field of Classification Search
CPC ... H01L 23/293; H01L 24/97; H01L 2224/97; H01L 2924/10253; H01L 2224/45144; H01L 21/565; H01L 21/561

USPC .......................................................... 438/113
See application file for complete search history.

(56) References Cited

U.S. PATENT DOCUMENTS 6,867,069 B2* 3/2005 Egawa et al. .................. 438/113
6,933,176 B1 8/2005 Kirloskar et al.
(Continued)

FOREIGN PATENT DOCUMENTS

JP A-2001-44324 2/2001
JP 2003-201416 A 7/2003
(Continued)

OTHER PUBLICATIONS

Jun. 17, 2014 Notification of Reasons for Refusal issued in Japanese Patent Application No. 2012-56202 (with partial English Translation).

(Continued)

*Primary Examiner* — Trung Q Dang
(74) *Attorney, Agent, or Firm* — Oliff PLC

(57) ABSTRACT

A method for producing a semiconductor apparatus with a mold including an upper mold half and a lower mold half, includes: an arranging step of arranging on one of the upper mold half and the lower mold half of the mold a substrate on which a semiconductor device is mounted, the mold being kept at a room temperature or heated to a temperature up to 200° C., and arranging on the other of the upper mold half and the lower mold half a substrate on which no semiconductor device is mounted; an integrating step of integrating the substrate on which the semiconductor device is mounted and the substrate on which no semiconductor device is mounted by molding a thermosetting resin with the mold on which the substrates are arranged; and a step of dicing the integrated substrates taken out of the mold to obtain an individualized semiconductor apparatus.

18 Claims, 1 Drawing Sheet

(51) Int. Cl.
  *H01L 23/29* (2006.01)
  *H01L 23/00* (2006.01)
  *H01L 23/31* (2006.01)

(52) U.S. Cl.
  CPC ............... *H01L 2224/48091* (2013.01); *H01L 2224/48227* (2013.01); *H01L 2224/97* (2013.01); *H01L 2924/10253* (2013.01); *H01L 2924/15311* (2013.01); *H01L 2924/15787* (2013.01); *H01L 2924/181* (2013.01)

(56) References Cited

U.S. PATENT DOCUMENTS

| | | | |
|---|---|---|---|
| 2004/0125568 A1 | 7/2004 | Tao | |
| 2006/0186431 A1* | 8/2006 | Miki et al. | 257/100 |
| 2007/0045791 A1 | 3/2007 | Saeki | |
| 2008/0157113 A1* | 7/2008 | Hayashi | 257/98 |
| 2008/0173995 A1 | 7/2008 | Kuratomi et al. | |
| 2008/0242768 A1* | 10/2008 | Nishihata | 523/468 |
| 2010/0109169 A1 | 5/2010 | Kolan et al. | |
| 2012/0162998 A1* | 6/2012 | Takahashi et al. | 362/363 |

FOREIGN PATENT DOCUMENTS

| | | |
|---|---|---|
| JP | A-2003-213087 | 7/2003 |
| JP | 2003-246848 A | 9/2003 |
| JP | A-2007-66932 | 3/2007 |
| JP | 2008-069291 A | 3/2008 |
| JP | 2008-084263 A | 4/2008 |
| JP | A-2009-32842 | 2/2009 |
| JP | 2009-170744 A | 7/2009 |
| JP | 2009-256583 A | 11/2009 |
| JP | A-2010-232471 | 10/2010 |
| JP | A-2011-228540 | 11/2011 |

OTHER PUBLICATIONS

Feb. 24, 2015 Office Action issued in Japanese Application No. 2012-056202.
May 27, 2015 Office Action issued in European Application No. 13001109.1.
May 24, 2016 Appeal Decision issued in Japanese Patent Application No. 2012-56202.
May 30, 2016 Office Action issued in Chinese Application No. 20130080256.3.

* cited by examiner

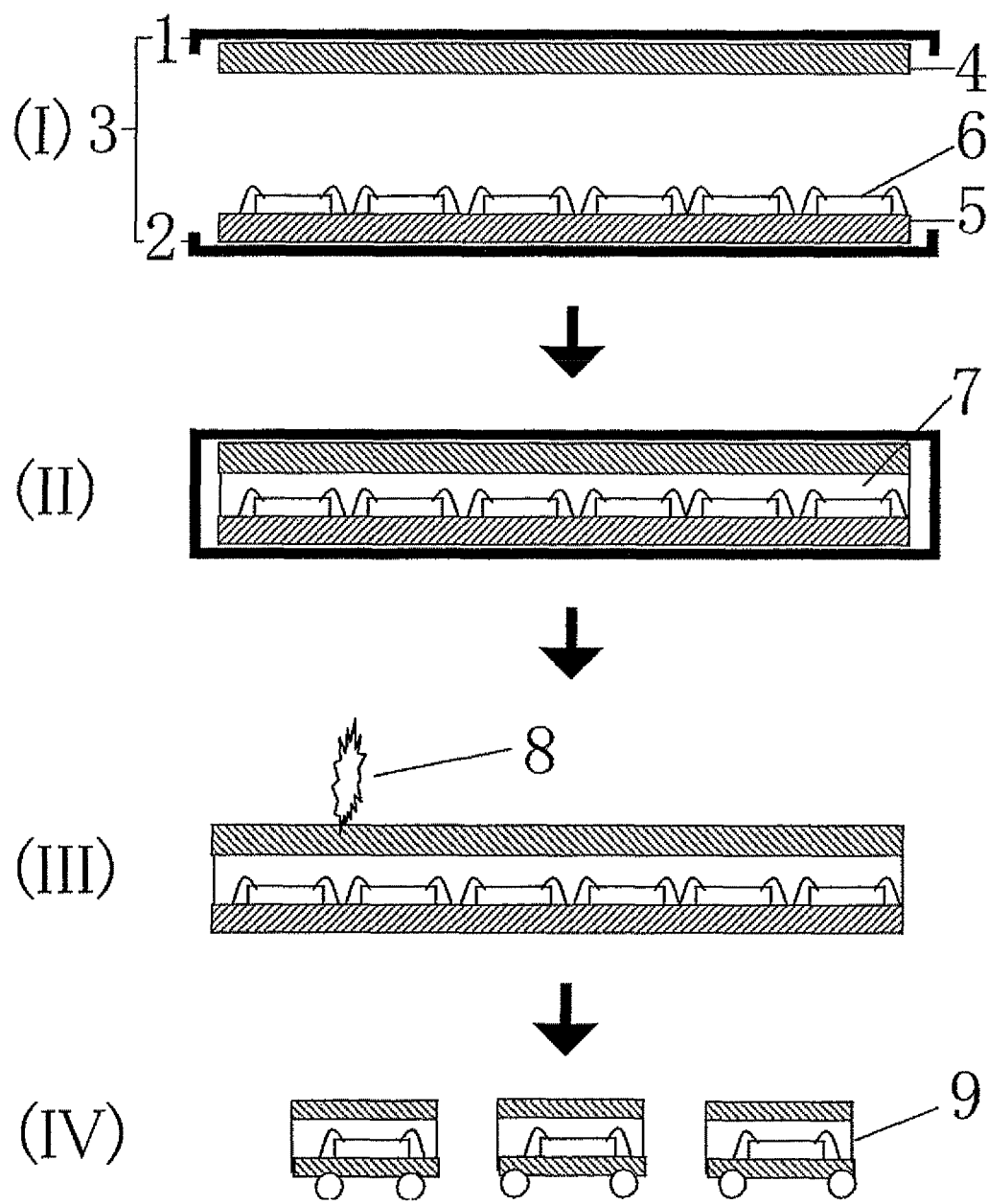

SEMICONDUCTOR APPARATUS AND METHOD FOR PRODUCING THE SAME

BACKGROUND OF THE INVENTION

1. Field of the Invention

The present invention relates to method for producing a semiconductor apparatus with a mold, and a semiconductor apparatus produced by the method.

2. Description of the Related Art

Various methods have been conventionally proposed and investigated for a sealing method on a wafer level, and a method for molding a thermosetting epoxy resin on one side of an organic substrate on which semiconductor devices are mounted in a matrix pattern (See Patent Documents 1 to 3).

In producing semiconductor apparatuses by the above-mentioned methods, for a small substrate, it is possible to control the warp of a substrate after sealing by adjusting a linear expansion coefficient of the applicable epoxy resin.

It is possible even at present to conduct sealing and molding without serious problems, in the case of using: a substrate such as a small diameter wafer on the order of 8 inches (200 mm); or an organic substrate in a small size. However, for wafers larger than 8-inch diameter or large organic substrates, the epoxy resin after sealing produces large contraction stress; a wafer or an organic substrate having a molded resin on its one side are broken or greatly warped, thereby disabling production of a semiconductor apparatus.

To solve the above problem caused by large wafers and metal substrates, it is exemplarily necessary to charge a filler into the resin up to a level of 95 wt %, and to lower the elasticity of the resin to thereby reduce its contraction stress upon curing. Unfortunately, such thermosetting resins, each containing a filler charged up to a level of 95 wt % and capable of being sufficiently molded, have been never produced. Further, lowering the elasticity of the resin down to a level to which the warp is not produced rather causes a problem of deterioration of heat resistance and moisture resistance of a semiconductor apparatus.

CITATION LIST

Patent Literature

[Patent Document 1] Japanese Patent Application Publication No. JP2001-044324A
[Patent Document 2] Japanese Patent Application Publication No. JP2003-213087A
[Patent Document 3] Japanese Patent Application Publication No. JP2009-032842A

SUMMARY OF THE INVENTION

The present invention has been carried out to solve the above problems, and it is therefore an object of the present invention to provide a method for producing a semiconductor apparatus in which the warp and break of a substrate after sealing can be suppressed even when a large substrate is sealed.

To solve the above problems, the present invention provides a method for producing a semiconductor apparatus with a mold including an upper mold half and a lower mold half, including:

an arranging step of arranging on one of the upper mold half and the lower mold half of the mold a substrate on which a semiconductor device is mounted, the mold being kept at a room temperature or heated to a temperature up to 200° C., and arranging on the other of the upper mold half and the lower mold half a substrate on which no semiconductor device is mounted;

an integrating step of integrating the substrate on which the semiconductor device is mounted and the substrate on which no semiconductor device is mounted by molding a thermosetting resin with the mold on which the substrates are arranged;

a step of dicing the integrated substrates taken out of the mold to obtain an individualized semiconductor apparatus.

Such method for producing a semiconductor apparatus is capable of suppressing the warp and break of a substrate after sealing, even when a large substrate is sealed. This method also enables collective sealing on a wafer level.

Further, it is possible that the integrating step is configured to: place the thermosetting resin onto the substrate arranged on the lower mold half, the thermosetting resin being in a liquid state at a room temperature or in a heated condition; and press the upper mold half and the lower mold half toward each other to perform compression molding of the thermosetting resin.

Alternatively, it is also possible that the integrating step is configured to: clamp the upper mold half and the lower mold half together; and pour the thermosetting resin into a gap between the substrates arranged on the upper mold half and lower mold half to perform injection molding or transfer molding of the thermosetting resin, the thermosetting resin being in a liquid state at a room temperature or in a heated condition.

In this way, the method for producing a semiconductor apparatus of the present invention is allowed to use any one of compression molding, injection molding, and transfer molding.

Furthermore, in the integrating step, the thermosetting resin is preferably molded under a reduced pressure.

Molding under a reduced pressure enables the thermosetting resin to be sufficiently charged into the gap between the substrate on which the semiconductor device is mounted and the substrate on which no semiconductor device is mounted.

Further, it is possible that a metal substrate, an inorganic substrate, or an organic resin substrate is used for the substrate on which the semiconductor device is mounted and/or the substrate on which no semiconductor device is mounted.

In this way, it is possible to use a metal substrate, inorganic substrate, or organic resin substrate, as the substrates to be used in the present invention.

Further, it is possible that any one of an epoxy resin, a silicone resin, and a silicone/epoxy hybrid resin is used as the thermosetting resin.

Using such a resin enables a semiconductor apparatus excellent in heat resistance and moisture resistance to be produced.

It is preferable that an organic resin substrate having a linear expansion coefficient between 5 and 25 ppm/° C. at a temperature in a range from a room temperature to 200° C. is used for the substrate on which the semiconductor device is mounted and/or the substrate on which no semiconductor device is mounted.

In this way, using two substrates having physical properties similar to those of the front and back surfaces of the semiconductor device enables the semiconductor apparatus to be produced substantially without occurrence of its warp.

Moreover, the present invention provides a semiconductor apparatus produced by the method for producing a semiconductor apparatus as described above.

Such a semiconductor apparatus is excellent in heat resistance and moisture resistance, and enables the warp to be suppressed, resulting in less residual strain.

As described above, the method for producing a semiconductor apparatus of the present invention is very versatile, and enables the warp and break of the substrate or wafer after sealing to be suppressed, even when sealing, with the resin, a semiconductor device array on which semiconductor devices are mounted on a large inorganic substrate, metal substrate, or organic resin substrate, or a large silicon wafer on which semiconductor devices are formed. Particularly, the method is capable of producing a semiconductor apparatus that are substantially free of warp and excellent in heat resistance and moisture resistance by using two substrates having physical properties similar to those of the front and back surfaces of the semiconductor device to seal the gap between the substrates by molding a thermosetting resin. This method also enables collective sealing on a wafer level; therefore reducing cost.

BRIEF DESCRIPTION OF THE DRAWINGS

The FIGURE is a flow diagram of a method for producing a semiconductor apparatus of the present invention.

DETAILED DESCRIPTION OF THE PREFERRED EMBODIMENTS

The method for producing a semiconductor apparatus of the present invention will be described below, and the present invention is not limited thereto. As described above, it has been desired to provide a method for producing a semiconductor apparatus in which the warp and break of a substrate after sealing can be suppressed even when a large substrate is sealed.

The present inventors have earnestly and repetitively conducted investigations so as to achieve the above object, and found out that it is possible to produce a semiconductor apparatus which is substantially free of the warp and excellent in heat resistance and moisture resistance by using two substrates each facing the front surface and the back surface of semiconductor devices, and sealing the gap between the substrates by molding a thermosetting resin, thereby completing the present invention. The present invention will be described in detail below.

Namely, the present invention resides a method for producing a semiconductor apparatus with a mold including an upper mold half and a lower mold half, including:

an arranging step of arranging on one of the upper mold half and the lower mold half of the mold a substrate on which a semiconductor device is mounted, the mold being kept at a room temperature or heated to a temperature up to 200° C., and arranging on the other of the upper mold half and the lower mold half a substrate on which no semiconductor device is mounted;

an integrating step of integrating the substrate on which the semiconductor device is mounted and the substrate on which no semiconductor device is mounted by molding a thermosetting resin with the mold on which the substrates are arranged;

a step of dicing the integrated substrates taken out of the mold to obtain an individualized semiconductor apparatus.

[(I) Arranging Step]

The FIGURE shows a flow diagram of the method for producing a semiconductor apparatus of the present invention. In the arranging step, a substrate 5 on which the semiconductor devices are mounted is arranged on one of an upper mold half 1 and a lower mold half 2 of a mold 3 (here, onto the lower mold half) that is kept at a room temperature or heated to a temperature up to 200° C., and a substrate 4 on which no semiconductor device is mounted on the other mold half (here, onto the upper mold halt). The arranging manner is not particularly limited, and may be performed by attaching by suction each substrate on the corresponding surface of the heated upper mold half 1 and lower mold half 2.

For the substrate on which the semiconductor devices are mounted and/or substrate on which no semiconductor device is mounted, an inorganic substrate, a metal substrate, or an organic resin substrate may be used. In the substrate on which the semiconductor devices are mounted, semiconductor devices are mounted on or formed in such a substrate. In the substrate on which no semiconductor device is mounted, no semiconductor device is mounted on or formed in such a substrate. Particularly, in the case of using an organic resin substrate, one containing fibers may be used from a standpoint of controlling an expansion coefficient as described later.

Examples of the inorganic substrate include a ceramic substrate, and a silicon wafer, and representative examples of the metal substrate include a copper or aluminum substrate having an insulated surface. Examples of the organic resin substrate include a BT (bismaleimido triazine) resin substrate, and an FRP (fiberglass reinforced plastic) substrate.

Examples of fibers utilizable in an organic resin substrate containing fibers, include: inorganic fibers such as a carbon fiber, a glass fiber, a quartz glass fiber, a metal fiber; organic fibers such as an aromatic polyamide fiber, a polyimide fiber, a polyamide imide fiber, and a silicon carbide fiber, a titanium carbide fiber, a boron fiber, and an alumina fiber. Examples of the organic resin substrate containing fibers include an epoxy resin substrate, a BT resin substrate, and a silicone resin substrate, each reinforced with these fibers. It is possible to use any types of substrates other than these types of resin substrates depending on product properties, as long as an electric insulation property is maintained. Most preferable organic resin substrates containing fibers are those each reinforced with glass fibers, quartz fibers, carbon fibers, or the like. Among them, those using glass fibers, or quartz glass fibers exhibiting a higher electric insulation property are particularly preferable.

Examples of the fibers for reinforcement as described above include: those in sheet shapes such as a roving having long fiber filaments aligned in one direction, a cloth, and a nonwoven fabric, and a chopped strand mat. They are not limited in particular, insofar as capable of forming a laminated body.

The metal substrate, inorganic substrate, or organic resin substrate preferably have a thickness of 20 μm to 1 mm, more preferably 50 μm to 500 μm, and most preferably 50 μm to 200 μm. For a thicknesses of 20 μm or greater, deformation of the substrate due to excessive thinness can be prevented and break of the substrate upon handling can be suppressed in the case or using an inorganic substrate. For a thicknesses of 1 mm or less, a semiconductor apparatus can be prevented from being excessively thickened.

It is preferable that the substrate on which the semiconductor devices are mounted and the substrate on which no semiconductor device is mounted are similar in physical properties and it is particularly preferable that both substrates have substantially the same linear expansion coefficients, or a linear expansion coefficient of 25 ppm/° C. or less, particularly 10 ppm/° C. or less. Particularly, when both substrates possess similar physical properties, the warp of a semiconductor apparatus after sealed by molding the thermosetting resin can be suppressed.

Further, in the case of using organic resin substrates as the substrate on which the semiconductor devices are mounted and substrate on which no semiconductor device is mounted, it is desirable, from a standpoint of reducing the warp of a semiconductor apparatus to be produced, that at least one of the organic resin substrates, more desirably both substrates, have a linear expansion coefficient between 5 and 25 ppm/° C. at a temperature in a range from a room temperature to 200° C. It is noted that the room temperature means 25° C.±10° C. in the present invention (the same rule applies correspondingly to the following).

Moreover, in the case of using an inorganic substrate such as a silicon wafer, or an organic resin substrate as the substrate on which the semiconductor devices are mounted, the inorganic substrate or organic resin substrate with semiconductor devices desirably has an expansion coefficient between 5 and 25 ppm/° C. in an X-Y direction at a temperature in a range from a room temperature to 200° C.

Also, in the case of using an organic resin substrate as the substrate on which no semiconductor device is mounted, the organic resin substrate desirably has an expansion coefficient between 5 and 25 ppm/° C. in an X-Y direction at a temperature in a range from a room temperature to 200° C. The organic resin substrate having an expansion coefficient in such a range has a small difference from that of the substrate on which the semiconductor device is mounted, thereby enabling suppression of the warp of a semiconductor apparatus being produced. It is noted that the organic resin substrate more desirably has an expansion coefficient between 5 and 20 ppm/° C., and most desirably between 5 and 15 ppm/° C.

The substrates are each in a size of about 20 mm to 200 mm in width and about 100 to 400 mm in length, from standpoints of productivity, and handling ability. Substrates in such a size are easy to arrange semiconductor devices thereon, and to be connected with gold wires by a wire bonder.

[(II) Integrating Step]

In the integrating step, a thermosetting resin 7 is molded between the substrate 5 on which the semiconductor devices are mounted and substrate 4 on which no semiconductor device is mounted arranged in the mold 3; thereby the substrate 5 on which the semiconductor devices 6 are mounted and the substrate 4 on which no semiconductor device is mounted are integrated. In this way, the two substrates are used at the front and back surfaces of semiconductor devices 6 to seal the gap between the substrates by molding the thermosetting resin; a semiconductor apparatus which is substantially free of its warp and excellent in heat resistance and moisture resistance can be produced. It is preferable that the gap between the integrated substrate on which the semiconductor devices are mounted and the substrate on which no semiconductor device is mounted is 20 to 1,000 μm.

In the integrating step, it is possible to use compression molding, transfer molding, injection molding, or the like, which are typically used. Specifically, the integrating step may be configured to: place the thermosetting resin in a liquid state at a room temperature or in a heated condition onto the substrate arranged on the lower mold half; and press the upper mold half and the lower mold half toward each other to perform compression molding of the thermosetting resin.

Alternatively, in the integrating step, the upper mold half and the lower mold half are clamped together; and the thermosetting resin in a liquid state at a room temperature or in a heated condition is poured into a gap between the substrates arranged on the upper mold half and lower mold half to perform injection molding or transfer molding of the thermosetting resin.

In the case of compression molding, the thermosetting resin 7 weighed is put on the substrate arranged on the lower mold half 2. The upper and lower mold halves are then clamped together under pressure to cure the resin.

Further, in the case of molding the thermosetting resin 7 by transfer molding or injection molding, the substrates are each attached by suction onto surfaces of the heated upper and lower mold halves, the upper and lower mold halves are then clamped together, the thermosetting resin 7 that liquefies at a room temperature or in a heated condition is pressurized and poured into the gap between the substrates and the resin is cured to integrate the upper and lower substrates together. The number of gates and structures for flowing the resin into the gap may be designed in accordance with the flowability, and curing characteristic of the resin, because the resin is required to be pressurizedly poured into a narrow and large gap.

Desirable curing and molding conditions include a temperature between 120° C. and 200° C., a time of 1 to 3 minutes, and a pressure between 20 and 150 Kg/cm$^2$. Further, to charge the resin fully into the gap, it is preferable to mold the thermosetting resin 7 under a reduced pressure, and particularly preferable to pressingly mold it while reducing the pressure in the mold. The pressure is preferably reduced to a degree close to a vacuum level.

Although the semiconductor apparatus 9 has a thickness depending on the thickness of semiconductor devices 6 to be mounted thereon, it is desirable for the former to have a thickness of 1 mm or less because household electric appliances can be downsized by using the semiconductor apparatus.

The thermosetting resin to be used in the integrating step is charged into between the two substrates and becomes a sealing resin layer for sealing. This thermosetting resin may be prepared in a form of composition containing another component. Preferably used as the thermosetting resin is: an epoxy resin in a liquid state at a room temperature that is commonly used for sealing semiconductor devices; and a solid epoxy resin, a silicone resin, or a silicone/epoxy hybrid resin comprising an epoxy resin and silicone resin, which are each typically liquefied by heating to 100° C. or lower.

Examples usable as the aforementioned epoxy resin include those known epoxy resins which are liquid or solid at a room temperature, including: bisphenol A type epoxy resins; bisphenol F type epoxy resins; biphenol type epoxy resins such as a 3,3',5,5'-tetramethyl-4,4'-biphenol type epoxy resin, or 4,4'-biphenol type epoxy resin; epoxy resins obtained by hydrogenating an aromatic ring(s) of a phenol novolak type epoxy resin, cresol novolak type epoxy resin, bisphenol A novolak type epoxy resin, naphthalenediol type epoxy resin, trisphenylol methane type epoxy resin, tetrakisphenylol ethane type epoxy resin, or phenol-dicyclopentadiene novolak type epoxy resin; alicyclic epoxy resins; and the like. Further, it is possible to combiningly use an epoxy resin other than the above, in a certain amount or less, as required.

It is noted that, since the thermosetting resin is to seal semiconductor devices, it is preferable to decrease halogen ions such as chloride ions or alkali ions such as sodium ions in the resin. It is typically desirable for both types of ions to be each 10 ppm or less based on an extraction at 120° C. where 10 g of an applicable specimen is added into 50 ml of ion exchange water, which is then hermetically closed and left to stand still in an oven at 120° C. for 20 hours, followed by extraction by heating.

Exemplarily usable as a curing agent for the epoxy resin are: a phenol novolak resin; various amine derivatives; and substances each obtained by partially ring-opening an acid anhydride or acid anhydride group to thereby produce a carboxylic acid. Desirable among them is the phenol novolak resin so as to ensure reliability of semiconductor apparatuses.

To promote a reaction between the epoxy resin and the curing agent, it is possible to exemplarily use: an imidazole derivative; a phosphine derivative; an amine derivative; and a metal compound such as an organic aluminum compound. For example, it is preferable to mix the epoxy resin and the phenol novolak resin at such a ratio of 1:0.8 to 1.3 between the number of epoxy groups and the number of phenolic hydroxyl groups.

It is also possible to further blend various additives into the epoxy resin composition, as required. For example, for the purpose of improving properties of the resin, it is possible to additionally blend, into the composition, an additive(s) such as: a stress lowering agent such as various thermoplastic resins, thermoplastic elastomers, organic synthetic rubbers, silicone-based substances; waxes; halogen trapping agents; and the like.

Usable as the aforementioned silicone resin are condensable or heat-curable silicone resins, and the like. Desirable among them is a composition of an addition curable silicone resin. To be preferably used as such an addition curable silicone resin composition is one containing, as indispensable components: (A) an organopolysiloxane having a noncovalent double bonding group (alkenyl group such as vinyl group, for example); (B) organohydrogenpolysiloxane; and (C) a platinum-based catalyst.

Moreover, examples of the aforementioned silicone/epoxy hybrid resin include: a copolymer comprising the above-described epoxy resin and the above-described silicone resin; and the like.

It is possible to blend an inorganic filler into the composition of the epoxy resin, silicone resin, or silicone/epoxy hybrid resin, which composition is usable as the thermosetting resin. Examples of the inorganic filler to be blended include: silicas such as fused silica, crystalline silica, and the like; alumina; silicon nitride; aluminum nitride; alumino silicate; boron nitride; glass fibers; antimony trioxide; and the like. Although these inorganic fillers are not particularly limited in average particle diameter, shape, and the like, it is desirable for them to each have a maximum particle diameter of 75 µm or less, preferably 50 µm or less, in order to ensure the filling ability of the resin into such a narrow gap of 1 mm or less between large-sized substrates. Particularly, when the gap between substrates is 500 µm or less, the average diameter of the filler particles is to be 30 µm or less at the maximum, and such particles are to be suitably in spherical shapes, respectively. Adopting a filler of 75 µm or less enables to restrict deterioration of local flowability and to ensure a sufficient filling ability, thereby restricting occurrences of voids, unfilled spaces, and the like.

Particularly, as the inorganic filler to be blended into the epoxy resin composition, it is possible to adopt such an inorganic filler having been previously subjected to a surface treatment by a coupling agent such as a silane coupling agent, titanate coupling agent, or the like, so as to enhance a coupling strength between the epoxy resin and the inorganic filler.

As such a coupling agent, it is preferable to use: an epoxy functional alkoxysilanes such as γ-glycidoxypropyl-trimethoxysilane, γ-glycidoxypropyl-methyldiethoxysilane, β-(3,4-epoxycyclohexyl)ethyltrimethoxysilane, or the like; an amino functional alkoxysilane such as N-β-(aminoethyl)-γ-aminopropyl-trimethoxysilane, γ-aminopropyl-triethoxysilane, N-phenyl-γ-aminopropyl-trimethoxysilane, or the like; a mercapto functional alkoxysilane such as γ-mercaptopropyl-trimethoxysilane, or the like; or the like. It is noted that the coupling agent to be used for the surface treatment is not particularly limited in blending amount, surface treatment manner, and the like.

Also in case of the silicone resin composition, and the silicone/epoxy hybrid resin composition, it is possible to treat surfaces of particles of the inorganic filler by the coupling agent as noted above.

The inorganic filler is to be preferably filled in an amount between 100 and 1,300 parts by weight, particularly between 200 and 1,000 parts by weight, relative to a total of 100 parts by weight of the resin contained in the epoxy resin composition, silicone resin composition, or silicone/epoxy hybrid resin composition. Amounts of 100 parts by weight or more enable to obtain a sufficient strength, and amounts of 1,300 parts by weight or less scarcely cause deterioration of flowability due to thickening, thereby enabling to prevent a defective filling ability, in a manner to fully seal semiconductor devices arranged on the applicable substrate. It is preferable to contain the inorganic filler within a range between 50 and 95 wt %, particularly between 60 and 90 wt %, relative to the total weight of the composition.

[(III) Taking Out Step and (IV) Dicing Step]

According to the above steps, large substrates on which semiconductor devices are mounted, without producing void, and warp. The substrates integrated by the above method are taken out of the mold, and subjected to post-curing typically at a temperature between 150 and 180° C. for 1 to 4 hours, thereby enabling to stabilize its electric characteristics, and its mechanical characteristics.

Further, the integrated substrates after post-curing are diced by a dicing blade 8 in a normal manner to produce an individualized semiconductor apparatus 9.

The semiconductor apparatus 9 produced by the above method for producing a semiconductor apparatus is a high-quality semiconductor apparatus restricted in its warp and its residual strains with excellent heat resistance and moisture resistance.

EXAMPLE

Although the present invention will be explained hereinafter in more detail by describing Examples and Comparative Examples, the present invention is not limited to these Examples and Comparative Examples.

Example 1

The following organic resin substrate on which semiconductor devices were mounted and organic resin substrate on which no semiconductor devices was mounted were prepared:

Organic resin substrate on which semiconductor devices were mounted of BT resin substrate (linear expansion coefficient of 15 ppm/° C.) of 50 µm thickness, 50 mm width, and 150 mm length, having 40 silicon chips each being 12 mm square and having 300 µm thickness, bonded to the substrate by an epoxy die bonding material, where the substrate and chips were connected by gold wires; and Organic resin substrate on which no semiconductor device was mounted of BT resin substrate (linear expansion coefficient of 15 ppm/° C.) of 50 µm thickness, 50 mm width, and 150 mm length.

In a transfer molding machine, a mold temperature was set at 170° C., and the organic resin substrate on which semicon ductor devices were mounted was attached by suction onto a lower mold half of the mold. In turn, the organic resin substrate on which no semiconductor device was mounted was attached by suction onto an upper mold half of the mold in the same manner, and then the upper and lower mold halves were closed to start pressure reduction. The substrates defined a gap of 500 μm therebetween.

The pressure was reduced down to 750 mmHg, a thermosetting epoxy resin (KMC300 produced by Shin-Etsu Chemical Co., Ltd., with maximum filler diameter of 35 μm) was charged into a pot of the molding machine, and the resin was transferred under a pressure of 70 Kg/cm² to thereby pour the resin into the above gap. This was followed by molding for 3 minutes.

After molding, the integrated substrates were taken out of the mold, and cooled down to a room temperature, followed by measurement of the warp of the substrates. The warp was 0.8 mm in the longitudinal direction, and 0.2 mm in the lateral direction. Further conducted was post curing at 180° C. for 2 hours, followed by measurement of the warp in the same manner. The warp was 0.4 mm in the longitudinal direction and 0.1 mm in the lateral direction; thus the substrates were substantially free of warp.

These substrates were adhered to a dicing tape, and diced into 40 individualized pieces whose back surfaces were each attached to solder balls, thereby producing semiconductor apparatuses. The individualized semiconductor apparatuses were checked electrically, and were all confirmed their functions without any problems.

Example 2

Prepared were the same organic resin substrate on which semiconductor devices were mounted and the same organic resin substrate on which no semiconductor device was mounted, as those used in Example 1. In a compression molding machine, a mold temperature was set at 170° C., and the organic resin substrate on which semiconductor devices were mounted was attached by suction onto a lower mold half of the mold. In turn, the organic resin substrate on which no semiconductor device was mounted was attached by suction onto an upper mold half of the mold in the same manner. A predetermined amount of thermosetting epoxy resin in a liquid state was then put onto a central portion of the substrate arranged by suction on the lower mold half, then the epoxy resin was pressurized by the upper and lower mold halves at 100 Kg/cm² and cured until the thickness of the resin was brought to 500 μm.

After molding, the integrated substrates were taken out of the mold, and cooled down to a room temperature, followed by measurement of the warp of the substrates. The warp was 0.9 mm in the longitudinal direction, and 0.3 mm in the lateral direction. Further conducted was post curing at 180° C. for 2 hours, followed by measurement of the warp in the same manner. The warp was 0.5 mm in the longitudinal direction and 0.1 mm in the lateral direction; thus the substrates were substantially free of warp.

These substrates were adhered to a dicing tape, and diced into 40 individualized pieces whose back surfaces each were attached to solder balls, thereby producing semiconductor apparatuses. The individualized semiconductor apparatuses were checked electrically, and were all confirmed their functions without any problems.

Example 3

The following silicon wafers were prepared:
Silicon wafer formed with semiconductor devices thereon of silicon wafer having a thickness of 350 μm and a diameter of 8 inches (200 mm), and formed with semiconductor devices thereon; and
Silicon wafer formed with no semiconductor devices thereon: silicon wafer having a thickness of 350 μm and a diameter of 8 inches (200 mm), and formed with no semiconductor devices thereon.

In a compression molding machine, a mold temperature was set at 170° C., and the silicon wafer formed with semiconductor devices was attached by suction onto a lower mold half of the mold. In turn, the silicon wafer formed with no semiconductor device was attached by suction onto an upper mold half of the mold in the same manner as the wafer formed with semiconductor devices, a predetermined amount of thermosetting epoxy resin (SMC800 produced by Shin-Etsu Chemical Co., Ltd.) in a liquid state was then put on a central portion of the wafer arranged by suction on the lower mold half, then the epoxy resin was pressurized by the upper and lower mold halves at 100 Kg/cm² and cured until the thickness of the resin was brought to 500 μm.

After molding, the integrated wafers were taken out of the mold, and cooled down to a room temperature, followed by measurement of the warp of the wafers. The warp was substantially zero in the longitudinal direction and in the lateral direction. Further conducted was post curing at 180° C. for 2 hours, followed by measurement of the warp in the same manner; thus the wafers were substantially free of warp.

These wafers were adhered to a dicing tape, and diced into 40 individualized pieces whose back surfaces were each attached to solder balls, thereby producing semiconductor apparatuses. The individualized semiconductor apparatuses were checked electrically, and were all confirmed their functions without any problems.

Comparative Example 1

Prepared was only the same organic resin substrate on which semiconductor devices were mounted, as that used in Example 1. In a transfer molding machine, a mold temperature was set at 170° C., and the organic resin substrate on which semiconductor devices were mounted was attached by suction onto a lower mold half of the mold. In turn, no organic resin substrate was arranged on an upper mold half of the mold, and the upper and lower mold halves were closed to start pressure reduction. The upper mold half and the substrate defined a gap of 500 μm therebetween.

The pressure was reduced down to 750 mmHg, a thermosetting epoxy resin (KMC300 produced by Shin-Etsu Chemical Co., Ltd., with maximum filler diameter of 35 μm) was charged into a pot of the molding machine, and the resin was transferred under a pressure of 70 Kg/cm² to thereby pour the resin into the above gap. This was followed by molding for 3 minutes.

After molding, the integrated substrate was taken out of the mold, and cooled down to a room temperature, followed by measurement of the warp of the substrate. The Warp was 29 mm in the longitudinal direction, and 8 mm in the lateral direction. Further conducted was post curing at 180° C. for 2 hours, followed by measurement of the warp in the same manner. The substrates had a large warp of 27 mm in the longitudinal direction and 6.3 mm in the lateral direction; therefore it was impossible to dice it into individualized semiconductor devices.

It is noted that the present invention is not limited to the above embodiments. The embodiments are illustrative, and whatever have substantially the same configuration as the technical concept recited in the claims of the present application and exhibit the same functions and effects, are embraced within the technical scope of the present invention.

What is claimed is:

1. A method for producing a semiconductor apparatus with a mold including an upper mold half and a lower mold half, the method comprising:
an arranging step of arranging on one of the upper mold half and the lower mold half of the mold a substrate on which a semiconductor device is mounted, the mold being kept at a room temperature or heated to a temperature up to 200° C., and arranging on the other of the upper mold half and the lower mold half a substrate on which no semiconductor device is mounted;
an integrating step of integrating the substrate on which the semiconductor device is mounted and the substrate on which no semiconductor device is mounted by molding a thermosetting resin blended with an inorganic filler with the mold on which the substrates are arranged; and
a step of dicing the integrated substrates taken out of the mold to obtain an individualized semiconductor apparatus,
wherein:
the inorganic filler has a maximum particle diameter of 75 μm or less,
an amount of the inorganic filler is between 100 and 1,300 parts by weight with respect to 100 parts by weight of the thermosetting resin,
the substrate on which a semiconductor device is mounted and the substrate on which no semiconductor device is mounted each have an area of 2,000 mm$^2$ or more and are collectively sealed,
the substrate on which no semiconductor device is mounted has a linear expansion coefficient of 25 ppm/° C. or less and a thickness of 20 μm to 1 mm, and
concentrations of each of halogen ions and alkali ions in the thermosetting resin are 10 ppm or less based on an extraction at 120° C. where 10 g of the thermosetting resin is added into 50 ml of ion exchange water, which is then hermetically closed and left to stand still in an oven at 120° C. for 20 hours, followed by extraction heating.

2. The method for producing a semiconductor apparatus according to claim 1, wherein the integrating step comprises:
placing the thermosetting resin onto the substrate arranged on the lower mold half, the thermosetting resin being in a liquid state at a room temperature or in a heated condition; and pressing the upper mold half and the lower mold half toward each other to perform compression molding of the thermosetting resin; or
clamping the upper mold half and the lower mold half together; and pouring the thermosetting resin into a gap between the substrates arranged on the upper mold half and lower mold half to perform injection molding or transfer molding of the thermosetting resin, the thermosetting resin being in a liquid state at a room temperature or in a heated condition.

3. The method for producing a semiconductor apparatus according to claim 1, wherein, in the integrating step, the thermosetting resin is molded under a reduced pressure.

4. The method for producing a semiconductor apparatus according to claim 2, wherein, in the integrating step, the thermosetting resin is molded under a reduced pressure.

5. The method for producing a semiconductor apparatus according to claim 1, wherein a metal substrate, an inorganic substrate, or an organic resin substrate is used for the substrate on which the semiconductor device is mounted and/or the substrate on which no semiconductor device is mounted.

6. The method for producing a semiconductor apparatus according to claim 2, wherein a metal substrate, an inorganic substrate, or an organic resin substrate is used for the substrate on which the semiconductor device is mounted and/or the substrate on which no semiconductor device is mounted.

7. The method for producing a semiconductor apparatus according to claim 3, wherein a metal substrate, an inorganic substrate, or an organic resin substrate is used for the substrate on which the semiconductor device is mounted and/or the substrate on which no semiconductor device is mounted.

8. The method for producing a semiconductor apparatus according to claim 4, wherein a metal substrate, an inorganic substrate, or an organic resin substrate is used for the substrate on which the semiconductor device is mounted and/or the substrate on which no semiconductor device is mounted.

9. The method for producing a semiconductor apparatus according to claim 1, wherein any one of an epoxy resin, a silicone resin, and a silicone/epoxy hybrid resin is used as the thermosetting resin.

10. The method for producing a semiconductor apparatus according to claim 2, wherein any one of an epoxy resin, a silicone resin, and a silicone/epoxy hybrid resin is used as the thermosetting resin.

11. The method for producing a semiconductor apparatus according to claim 3, wherein any one of an epoxy resin, a silicone resin, and a silicone/epoxy hybrid resin is used as the thermosetting resin.

12. The method for producing a semiconductor apparatus according to claim 4, wherein any one of an epoxy resin, a silicone resin, and a silicone/epoxy hybrid resin is used as the thermosetting resin.

13. The method for producing a semiconductor apparatus according to claim 5, wherein any one of an epoxy resin, a silicone resin, and a silicone/epoxy hybrid resin is used as the thermosetting resin.

14. The method for producing a semiconductor apparatus according to claim 6, wherein any one of an epoxy resin, a silicone resin, and a silicone/epoxy hybrid resin is used as the thermosetting resin.

15. The method for producing a semiconductor apparatus according to claim 7, wherein any one of an epoxy resin, a silicone resin, and a silicone/epoxy hybrid resin is used as the thermosetting resin.

16. The method for producing a semiconductor apparatus according to claim 8, wherein any one of an epoxy resin, a silicone resin, and a silicone/epoxy hybrid resin is used as the thermosetting resin.

17. The method for producing a semiconductor apparatus according to claim 1, wherein an organic resin substrate having a linear expansion coefficient between 5 and 25 ppm/° C. at a temperature in a range from a room temperature to 200° C. is used for the substrate on which the semiconductor device is mounted and/or the substrate on which no semiconductor device is mounted.

18. The method for producing a semiconductor apparatus according to claim 16, wherein an organic resin substrate having a linear expansion coefficient between 5 and 25 ppm/° C. at a temperature in a range from a room temperature to 200° C. is used for the substrate on which the semiconductor device is mounted and/or the substrate on which no semiconductor device is mounted.

* * * * *